United States Patent [19]

Lee et al.

[11] Patent Number: 5,798,301

[45] Date of Patent: Aug. 25, 1998

[54] METHOD OF MANUFACTURING METAL INTERCONNECT STRUCTURE FOR AN INTEGRATED CIRCUIT WITH IMPROVED ELECTROMIGRATION RELIABILITY

[75] Inventors: Pei-Ing Paul Lee, Lagrangeville; Bernd Vollmer, Wappingers Falls; Darryl Restaino, Modena, all of N.Y.; Bill Klaasen, Underhills, Vt.

[73] Assignees: Siemens Aktiengesellschaft, Munich, Germany; International Business Machines Corporation, Armonk, N.Y.

[21] Appl. No.: 841,030

[22] Filed: Apr. 29, 1997

Related U.S. Application Data

[60] Continuation of Ser. No. 634,492, Apr. 18, 1996, abandoned, which is a division of Ser. No. 513,494, Aug. 10, 1995, Pat. No. 5,641,992.

[51] Int. Cl.$^6$ ............................................. H01L 21/283
[52] U.S. Cl. .......................... 438/653; 438/656; 438/660; 438/688
[58] Field of Search ......................... 438/627, 648, 438/653, 651, 688, 683, 660

[56] References Cited

U.S. PATENT DOCUMENTS

| | | | |
|---|---|---|---|
| 3,879,840 | 4/1975 | Ames et al. | 438/688 |
| 5,240,880 | 8/1993 | Hindman et al. | 438/683 |
| 5,266,521 | 11/1993 | Lee et al. | 437/188 |
| 5,270,254 | 12/1993 | Chen et al. | 437/190 |
| 5,270,255 | 12/1993 | Wong | 438/688 |
| 5,371,042 | 12/1994 | Ong | 438/660 |
| 5,378,660 | 1/1995 | Ngan et al. | 437/247 |
| 5,427,666 | 6/1995 | Mueller et al. | 204/192.17 |
| 5,478,780 | 12/1995 | Koezner et al. | 437/190 |
| 5,658,828 | 8/1997 | Lin et al. | 438/688 |

*Primary Examiner*—T. N. Quach
*Attorney, Agent, or Firm*—Donald B. Paschburg

[57] ABSTRACT

A multilayer interconnect structure for a semiconductor integrated circuit comprising a base layer of titanium, a second layer of titanium nitride, a third layer of an aluminum alloy and a top layer of titanium nitride. All of the layers contained within the multilayer interconnect structure are deposited by in-situ deposition in an ultra-high vacuum deposition system. The different layers deposited in the deposition system are conducted consecutively without a disruption to the vacuum. Although each layer in the multilayer interconnect structure are deposited within the integrated ultra-high vacuum deposition system, with multiple deposition chambers, the deposition of the different layers is conducted at different temperatures. The time to the electromigration failure of the multilayer interconnect structure, caused by the electromigration of the aluminum alloy, is greatly increased by depositing the aluminum alloy layer at a temperature in excess of 300° C. and preferably between 350° C. and 550° C. The titanium layer and the adjacent titanium nitride layer below the aluminum alloy layer provide the interconnect structure with low resistivity and prevent alloy spiking of the base substrate. As a result, a multilayer interconnect structure provided that has improved electromigration reliability and a low resistance, thereby enabling more dense applications within an integrated circuit.

9 Claims, 3 Drawing Sheets

METHOD OF MANUFACTURING METAL INTERCONNECT STRUCTURE FOR AN INTEGRATED CIRCUIT WITH IMPROVED ELECTROMIGRATION RELIABILITY

CROSS-REFERENCE TO RELATED APPLICATION

This is a continuation of Ser. No. 08/634,492 filed Apr. 18, 1996, abandoned, which is a divisional of Ser. No. 08/513, 494 filed Aug. 10, 1995, U.S. Pat. No. 5,641,992.

BACKGROUND OF THE INVENTION

1. Field of the Invention

The present invention relates generally to the interconnect structures contained within an integrated circuit device. More particularly, the present invention relates to a multilayer interconnect structure that uses layers of titanium, titanium nitride and aluminum-copper alloy to improve electromigration reliability.

2. Description of the Prior Art

Integrated circuits generally comprise a semiconductor substrate upon which are formed various electronic components such as transistors, diodes and the like. Interconnect layers are formed on the semiconductor substrate to electrically interconnect the various electronic components to each other and to external components. Traditionally, the interconnect layers used on the semiconductor substrate have been made from polysilicon films, high temperature metal films, metal silicide films, aluminum films and aluminum alloy films. Each of these interconnect layers have an inherent resistance. The performance characteristics of highly integrated, high speed integrated circuits require that the resistance within the interconnect layers be held to a minimum. As a result, high speed integrated circuits typically use interconnect structures made of aluminum films or aluminum alloy films that have a relatively small resistivity as compared to the other interconnect structure choices.

In the prior art, it has been shown that the use of an aluminum film or an aluminum alloy film directly on a silicon-based semiconductor substrate is highly problematic. When the aluminum comes into direct contact with the silicon-based semiconductor substrate, an adverse electromigration reaction occurs causing an alloy spike in the semiconductor substrate. The alloy spike may extend through the region of the impurity diffusion layer and extend downwardly into the semiconductor substrate, thereby resulting in a junction leak at the impurity diffusion layer. In order to prevent the degradation of the impurity diffusion layer, a barrier film is commonly deposited between the silicon-based semiconductor substrate and the aluminum containing interconnect structure.

The prior art is replete with references that show the use of a barrier film between an aluminum alloy interconnect structure an underlying semiconductor substrate. Such prior art references are exemplified by U.S. Pat. No. 5,278,099 to Maeda, entitled METHOD FOR MANUFACTURING A SEMICONDUCTOR DEVICE HAVING WIRING ELECTRODES, and U.S. Pat. No. 5,313,101 to Harada et al., entitled INTERCONNECT STRUCTURE OF SEMICONDUCTOR INTEGRATED CIRCUIT DEVICE. Both of these patents disclose the use of titanium nitride (TiN) as a barrier film.

Although barrier films have been used, electromigration still occurs between the aluminum alloy interconnect structure and the underlying silicon-based semiconductor substrate. In order to limit the amount of electromigration induced failure in an integrated circuit, the current density is limited within the interconnect structures. The imposed current limitations on the interconnect structures limit the design flexibility and circuit density supported by integrated circuit technologies. The problems associated with electromigration become more severe with the small linewidths and line thicknesses used in advanced integration technologies. As a result, the limitations of prior art interconnect structures impact the reliability of the overall circuit, as well as chip density and performance.

It is, therefore, an objective of the present invention to provide an interconnect structure for an integrated circuit that prevents alloy spiking of the below lying substrate and has greatly improved electromigration reliability, thereby enabling integrated circuits that are more reliable, have higher performance rates and have increased chip density.

SUMMARY OF THE INVENTION

The present invention is a multilayer interconnect structure for a semiconductor integrated circuit comprising a base layer of titanium, a second layer of titanium nitride, a third layer of an aluminum alloy and a top layer of titanium nitride. All of the layers contained within the multilayer interconnect structure are deposited by in-situ deposition in an ultra-high vacuum deposition system. The different layers deposited in the deposition system are conducted consecutively without a disruption to the vacuum. Although each layer in the multilayer interconnect structure are deposited within the integrated ultra-high vacuum deposition system, with multiple deposition chambers, the deposition of the different layers is conducted at different temperatures. The time to the electromigration failure of the multilayer interconnect structure, caused by the electromigration of the aluminum alloy, is greatly increased by depositing the aluminum alloy layer at a temperature in excess of 300° C. and preferably between 350° C. and 550° C. The titanium layer and the adjacent titanium nitride layer below the aluminum alloy layer provide the interconnect structure with low resistivity and prevent alloy spiking of the base substrate. As a result, a multilayer interconnect structure is provided that has improved electromigration reliability and a low resistance, thereby enabling more dense applications within an integrated circuit.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE INVENTION

Figure 1:
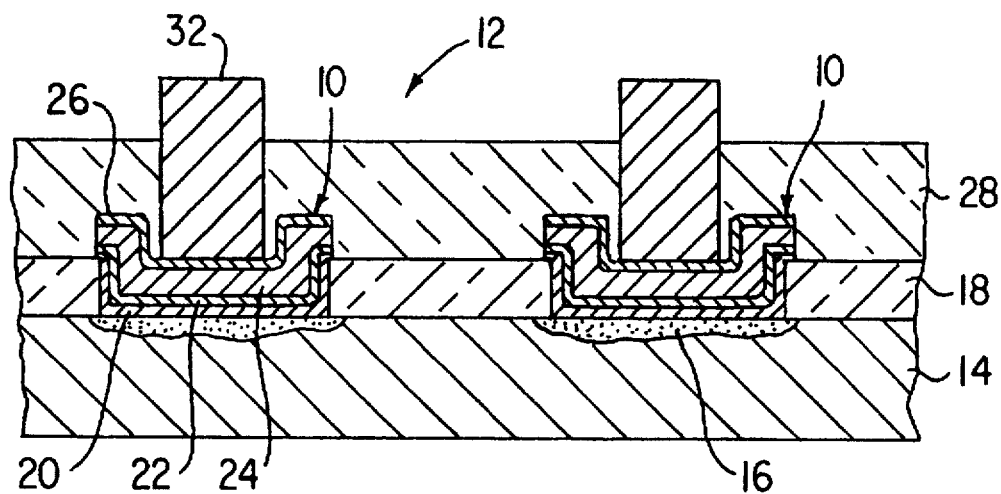
FIG. 1 is a cross-sectional view of a segment of a integrated circuit formed on a silicon-based substrate, containing a preferred embodiment of the present invention multilayer interconnect structure.

The present invention is a multilayer interconnect structure for use within an integrated circuit. Referring to FIG. 1, an exemplary embodiment of the present invention multilayer interconnect structure 10 is shown as part of an integrated circuit segment 12. The integrated circuit segment 12 includes a silicon-based substrate 14 upon which are disposed doped regions 16. An insulating oxide film 18 is deposited over the silicon-based substrate 14 leaving the doped regions 16 exposed. The multilayer interconnect structures 10 are deposited over the insulating oxide layer 18 and the exposed doped regions 16 of the silicon-based substrate 14. The multilayer interconnect structure 10 is comprised of a layer of titanium (Ti) 20, a layer of titanium nitride (TiN) 22, a layer of aluminum copper alloy 24 and a top layer of titanium nitride 26. The multilayer interconnect structures 10 are isolated from each other by a second oxide layer 28. Segments of a metal contact layer 32 extend through the second oxide layer 28 and contact the multilayer interconnect structures 10, thereby providing a means for electrically coupling the multilayer interconnect structures 10 to external components.

The function of the various layers of the multilayer interconnect structures 10 will be explained with reference to FIGS. 2 through 6 which also serve to illustrate the preferred method of fabricating the present invention multilayer interconnect structures 10.

Figure 2:
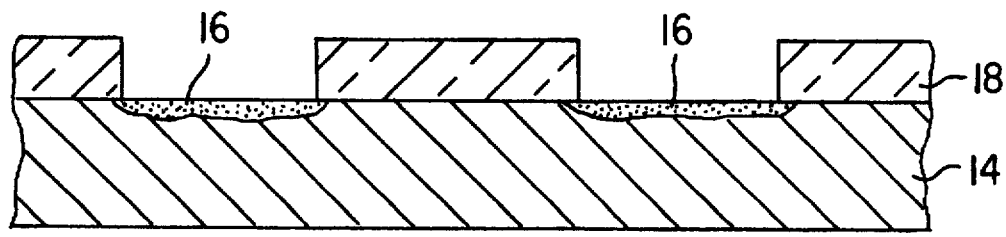
FIG. 2 is a cross-sectional view of the silicon-based substrate upon which the present invention multilayer interconnect structure is deposited.

Referring to FIG. 2, a silicon-based semiconductor substrate 14 is provided. The silicon-based substrate is selectively doped by conventional methods creating the doped regions 16. The doped regions 16 may be formed as part of a transistor structure or any other integrated component. An oxide layer 18 is deposited onto the silicon-based substrate 14 using tradition deposition techniques. The oxide layer 18 is selectively etched, thereby exposing the doped regions 16 on the silicon-based substrate 14.

Figure 3:
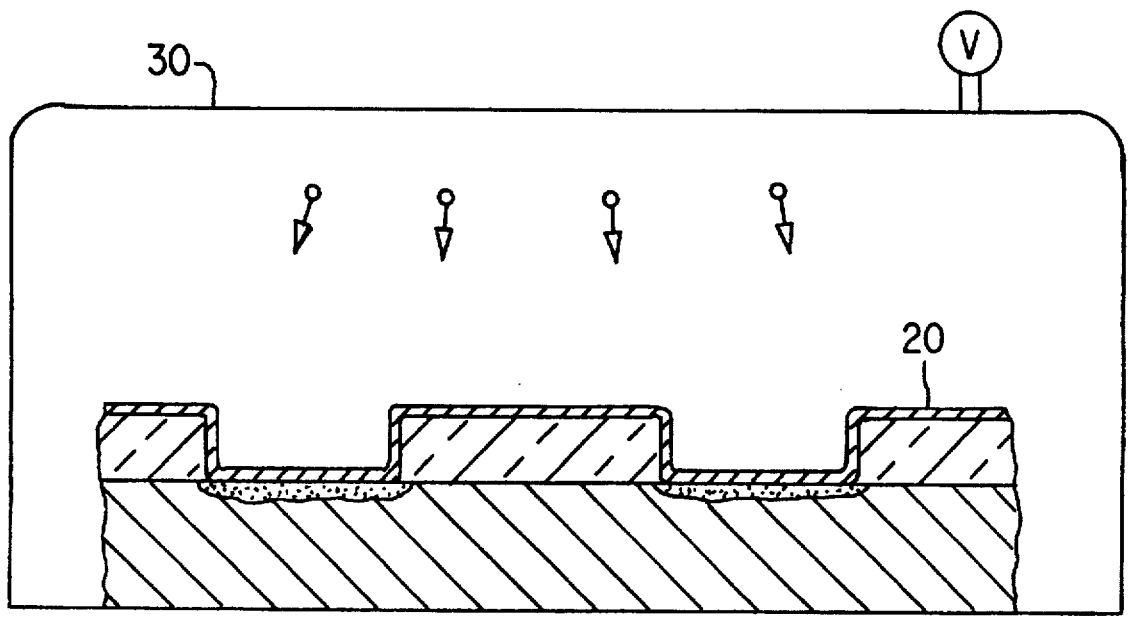
FIG. 3 is a cross-sectional view of the first titanium layer of the present invention interconnect structure deposited on the silicon-based substrate of FIG. 2.
Figure 4:
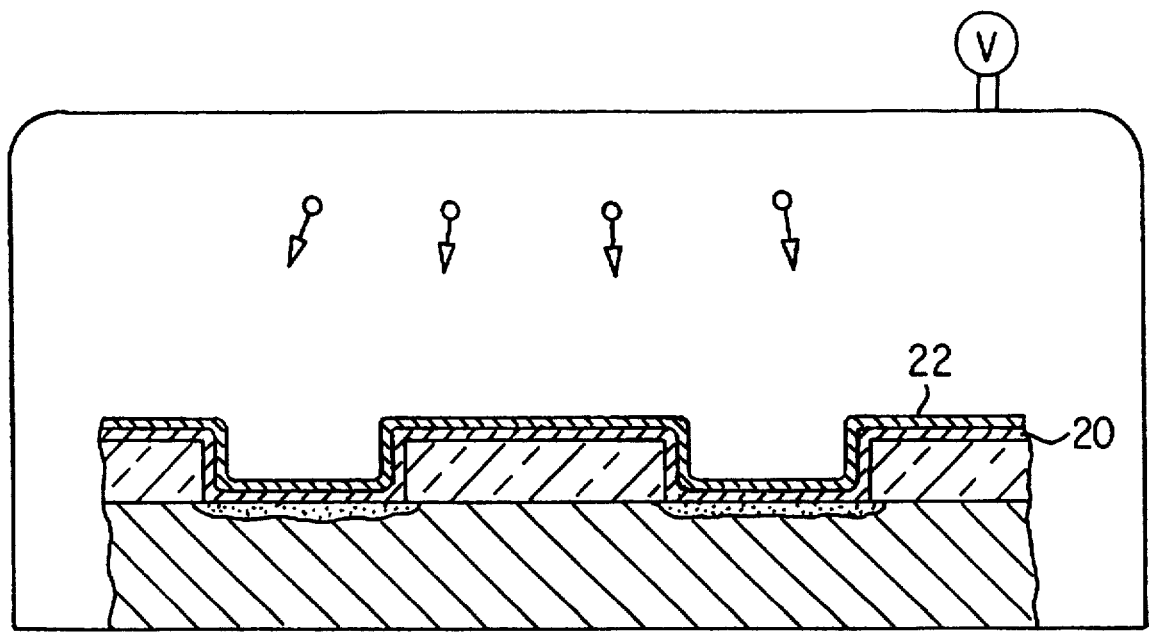
FIG. 4 is a cross-sectional view of the second titanium nitride layer of the present invention interconnect structure deposited on the titanium layer of FIG. 3.

Once the oxide film 18 had been etched, the silicon-based substrate 14 is placed within a clustered ultra-high vacuum (UHV) deposition system. Referring to FIG. 3, the UHV deposition chamber 30 is evacuated to an ultra high vacuum where the pressure of oxygen and other reactive impurity gases within the UHV deposition chamber are reduced to below $10^{-6}$ Pa. The silicon-based substrate 14 and oxide layer 18 are heated and cleaned of impurities within the UHV deposition chamber 30. Without release of the ultra high vacuum, a layer of titanium 20, approximately 250 A thick, is deposited in-situ over the oxide layer 18 and the exposed doped regions 16. In a preferred embodiment the Ti layer 20 is deposited at a temperature between 150° C. and 300° C. In FIG. 4, it is shown that a layer of titanium nitride 22, approximately 250 A thick, is then deposited over the Ti layer 20. The TiN layer 22 is deposited in-situ within the same UHV deposition chamber 30 without release of the vacuum between the Ti deposition and the TiN deposition. The TiN layer 22 is preferably deposited at between 150° C. and 350° C.

Figure 5:
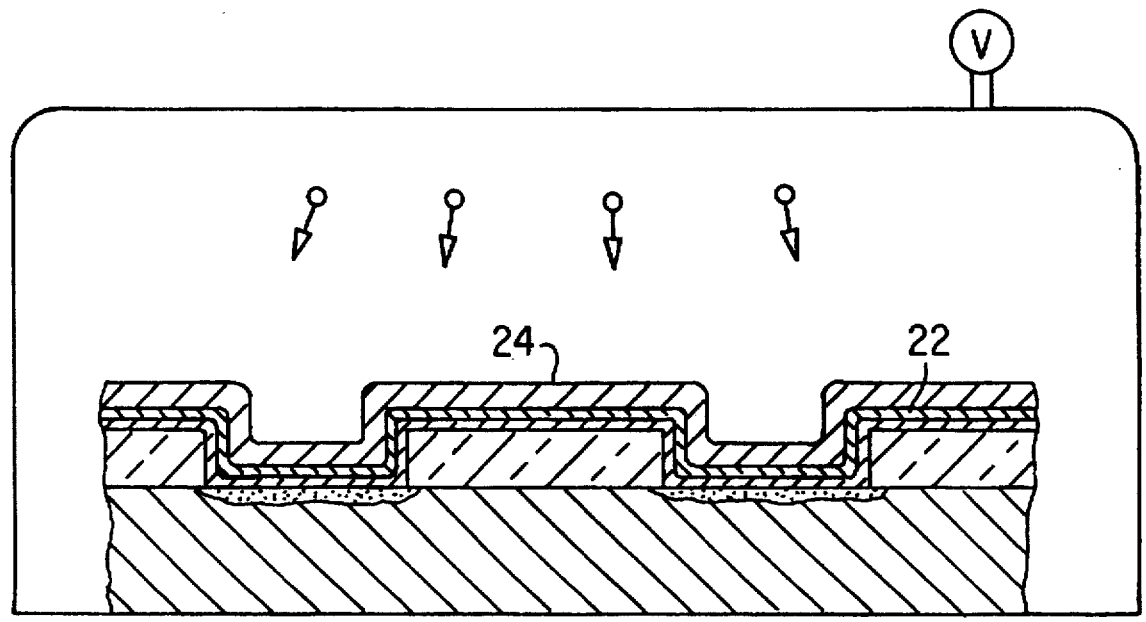
FIG. 5 is a cross-sectional view of the third aluminum alloy layer of the present invention interconnect structure deposited on the second titanium nitride layer of FIG. 4.
Figure 6:
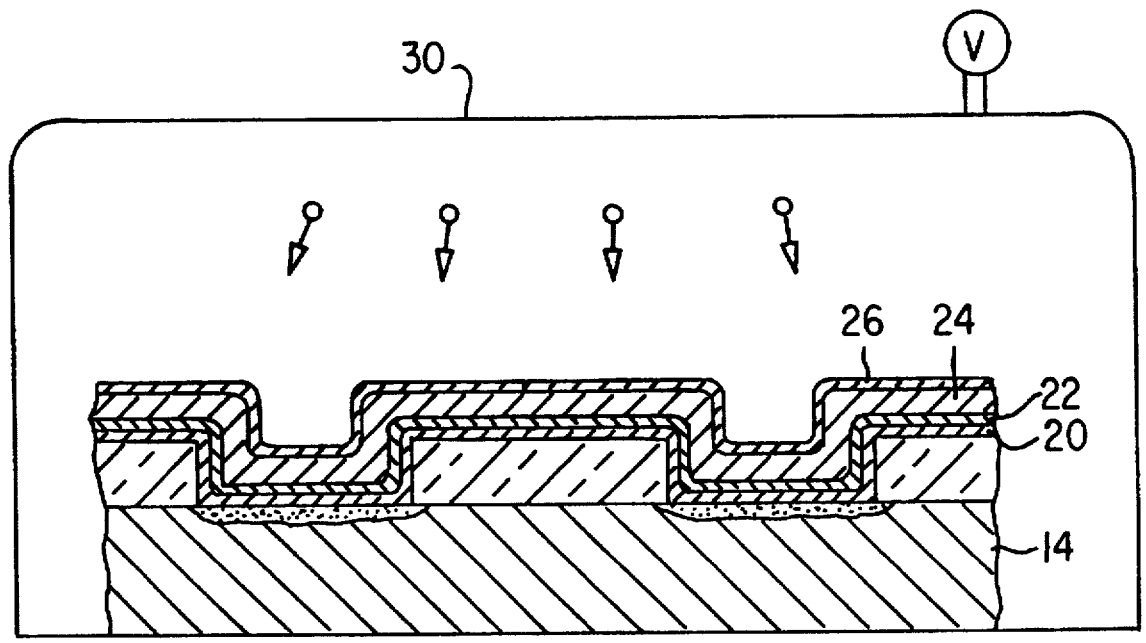
FIG. 6 is a cross-sectional view of the forth titanium layer of the present invention interconnect structure deposited on the third aluminum alloy layer of FIG. 5.

Referring to FIG. 5, it can be seen that a layer of aluminum alloy 24 is deposited over the TiN layer 22. In the preferred embodiment, the aluminum alloy layer 24 is Al-0.5% Cu. The aluminum alloy layer 24 is deposited at a thickness of approximately 1 µm, and deposition is conducted at a high temperature. The deposition of the aluminum alloy layer 24 is performed in the UHV deposition chamber 30 with no release of the ultra high vacuum between the TiN deposition and the aluminum alloy deposition. The aluminum alloy deposition is preferably performed at the highest temperature possible, given the temperature tolerances of the substrate 14, oxide layer 18, Ti layer 20 and TiN layer 22. The deposition temperature should be at least 350° C. but preferably deposition should be performed near or about 550° C. Lastly, referring to FIG. 6, a TiN antireflection layer 26 is deposited over the aluminum alloy layer 24, thereby completing the four layers of the interconnect structure 10. The TiN antireflection layer 26 is deposited in the same UHV deposition chamber 30 as are the other layers of the interconnect structure 10, without a release of the ultra high vacuum. Since the TiN layer 22 below the aluminum alloy layer 24 has already been deposited, the deposition source and targets already exist within the UHV deposition chamber 30 to deposit the TiN antireflection layer 26. This reduces the complexity and cost associated with manufacturing the overall interconnect structure 10.

The Ti layer 20 is provided to function as a barrier metal layer between the aluminum alloy layer 24 and the silicon-based substrate 14. However, the Ti layer 20 alone, while being a superior contact material in achieving a low resistance ohmic contact, does not act as a complete barrier to alloy spikes. If the Ti layer 20 alone were provided between the silicon-based substrate 14 and aluminum alloy layer 24, the titanium would react simultaneously with the silicon and the aluminum, so that alloy spikes into the silicon-based substrate eventually would occur. It is for this reason that the TiN layer 22 is provided between the Ti layer 20 and the aluminum alloy layer 24. The TiN layer 22 acts as a barrier metal to block aluminum diffusion along the grain boundaries in the aluminum alloy layer 24, thus preventing the growth of alloy spikes. The Ti layer 20 and the TiN layer 22 have a high resistance to electromigration and will constitute a current path even if the aluminum alloy layer 24 were to fail due to electromigration. As a result, a complete failure of the overall multilayer interconnect structure 10 is prevented.

The in-situ deposition of the Ti layer 20, TiN layer 22 and aluminum alloy layer 24 in an uninterrupted UHV deposition chamber in combination with the high temperature deposition of the aluminum alloy layer 24 results in an improved electromigration life of up to four times that of prior art interconnect structures that also use titanium based boundary layers. Referring to Tables I and II below, seven different interconnect structures are tested in comparison with the four layer interconnect structure of the present invention. In both tables, the present invention is represented by test sample #7.

TABLE I

| Test Sample | T. Layer Thickness | Dep Temp | TiN Layer Thickness | Dep Temp | Alloy, Thickness, Dep Temp | TiN Layer Thickness | Dep Temp |
|---|---|---|---|---|---|---|---|
| #1 | 250A | 250° C. | — | — | Al-.5% Cu-.15% Ti, 1 μm, 250° C. | 375A | 300° C. |
| #2 | 250A | 250° C. | — | — | Al-.5% Cu-1% Si, 1 μm, 250° C. | 375A | 300° C. |
| #3 | 250A | 250° C. | — | — | Al-.5% Cu-.5% Si, 1 μm, 250° C. | 375A | 300° C. |
| #4 | 250A | 250° C. | — | — | Al-.5% Cu-.15% Si, 1 μm, 250° C. | 375A | 300° C. |
| #5 | 250A | 250° C. | — | — | Al-.5 Cu, 1 μm, 250° C. + 500A Ti | 375A | 300° C. |
| #6 | 250A | 250° C. | 250A | 150° C. | Al-.5 Cu, 1 μm, 150° C. | 375A | 150° C. |
| #7 | 250A | 250° C. | 250A | 300° C. | Al-.5 Cu, 1 μm, 350° C. | 375A | 300° C. |

In Table II below, the electromigration lifetime (ELT) and sigma of the electromigration fail distribution are summarized for the seven test samples set forth in Table I. In testing, four down stream electromigration test structures were used with variation of metal line width and number of vias. The test structures consist of M1 tungsten cap aluminum line, tapered vias (only one size allowed), and a RIE M2 line. The electromigration test structure is designed to void the M2 near the Via 2, simulating the weakest point in normal product design.

TABLE II

Electromigration Result, ELT (hours)/sigma

| Test Sample | Alloy | M2V21 1.2u 1 via | M2V23 1.2u 4 via | M2V24 3.8u 12 via | M2V22 3.8u 3 via |
|---|---|---|---|---|---|
| #1 | AlCuTi | 30/0.34 | 103/0.17 | 17/0.37 | 31/0.32 |
| #2 | AlCu1%Si | 31/0.22 | 147/0.11 | 15/0.21 | 39/0.18 |
| #3 | AlCu0.5%Si | 36/0.18 | 138/0.27 | 12/0.28 | 25/0.23 |
| #4 | AlCu0.15%Si | 32/0.20 | 128/0.14 | 12/0.20 | 32/0.21 |
| #5 | AlCu250C w/Ti | 36/0.25 | 107/0.2 | 13.5/0.2 | 34.0/2 |
| #6 | AlCu50C w/TIN | 58/0.43 | 190/0.24 | 18/0.35 | 50/0.25 |
| #7 | AlCu350C w/TIN | 81/0.35 | 450 | 61/0.33 | 116/0.26 |

As can be seen from Table II, the electromigration life time (ELT) of the present invention interconnect structure (sample #7) is between two times and four times as long as the other samples tested. It should further be noted that although the prior art does use Ti/TiN/aluminum alloy interconnect structures, the prior art does not deposit the aluminum alloy with in-situ UHV deposition at temperatures in excess of 300° C. Rather the prior art is more indicative of test sample #6, wherein Ti/TiN/aluminum alloy is deposited at low temperatures using traditional deposition techniques. As can be seen, the present invention test sample still has an ELT of between two times and four times greater than the other samples even though the same base materials are used.

Returning to FIG. 1, it can be seen that after the present invention interconnect structure 10 is deposited, the interconnect structure 10 is etched and covered with an insulating second oxide layer 28. The second oxide layer 28 is then etched in the areas above where the interconnect structure 10 is to be engaged. A metal contact layer 32 is deposited upon the second oxide layer 28 and the exposed region of the interconnect structure 10. The metal contact layer 32 is then selectively etched, providing external contacts for coupling the underlying interconnect structure 10 to external components. Since the first TiN layer 22 under the aluminum alloy layer 24 has a thickness sufficient to prevent the growth of alloy spikes, the aluminum alloy layer 24 need not contain silicon. As a result, silicon does not precipitate in the metal contact layer 32 and the problems of silicon precipitation are avoided.

It will be under that the four-layer interconnect structure and method of manufacture described herein are merely exemplary and that a person skilled in the art may make variations to layer thicknesses and deposition temperatures within the disclosed ranges. All such variations and modifications are intended to be included within the scope of the invention as defined by the appended claims.

What is claimed is:

1. A method of manufacturing a multilayer interconnect structure for a semiconductor integrated circuit, comprising the steps of:

placing a substrate in a single vacuum chamber;
  evacuating said chamber to a pressure below $10^{-6}$ Pa;
  depositing a titanium layer on a substrate:
  depositing a titanium nitride layer on said titanium layer, and
  depositing an aluminum alloy layer directly on said titanium nitride layer, wherein said aluminum alloy is deposited at a temperature in excess of 500° C.;
  wherein said pressure of below $10^{-6}$ Pa is consistently maintained during said steps of depositing a titanium layer, depositing a titanium nitride layer and depositing an aluminum alloy layer.

2. The method according to claim 1, wherein said aluminum alloy layer does not contain silicon.

3. The method according to claim 1, wherein said aluminum alloy layer is an aluminum-copper alloy.

4. The method according to claim 6, wherein said aluminum alloy layer is Al-0.5% Cu.

5. The method according to claim 1, wherein said titanium layer, said titanium nitride layer and said aluminum alloy layer are deposited in-situ within said single vacuum chamber.

6. The method according to claim 1, wherein said aluminum alloy layer is deposited at a temperature of approximately 550° C.

7. A method of forming a multilayer interconnect structure on a substrate, comprising the steps of:

placing said substrate in a vacuum deposition chamber;

evacuating said chamber to a pressure below $10^{-6}$ Pa;

depositing a titanium layer on said substrate at a first temperature;

depositing a titanium nitride layer on said titanium layer at a second temperature;

depositing an aluminum alloy layer directly on said titanium nitride layer at a third temperature in excess of 500° C.; and depositing a second titanium nitride layer on said aluminum alloy layer at a fourth temperature;

wherein said pressure of below $10^{-6}$ Pa is consistently maintained during said steps of depositing a titanium layer, depositing a titanium nitride layer, depositing an aluminum alloy layer and depositing a second titanium nitride layer.

8. The method according to claim 7, wherein said first temperature, said second temperature and said fourth temperature are between 150° C. and 300° C.

9. The method according to claim 7, wherein said third temperature is approximately 550° C.

* * * * *